(12) United States Patent
Haralabidis

(10) Patent No.: US 7,595,677 B2
(45) Date of Patent: Sep. 29, 2009

(54) ARBITRARY CLOCK CIRCUIT AND APPLICATIONS THEREOF

(75) Inventor: Nikolaos Haralabidis, Athens (GR)

(73) Assignee: Broadcom Corporation, Irvine, CA (US)

(*) Notice: Subject to any disclaimer, the term of this patent is extended or adjusted under 35 U.S.C. 154(b) by 63 days.

(21) Appl. No.: 11/863,686

(22) Filed: Sep. 28, 2007

(65) Prior Publication Data

US 2009/0085630 A1    Apr. 2, 2009

(51) Int. Cl.
*G06F 1/04* (2006.01)
(52) U.S. Cl. .................. 327/291; 327/116
(58) Field of Classification Search .............. 327/113, 327/114, 115, 116, 117, 119, 131, 291, 293, 327/294, 295, 296, 298, 299
See application file for complete search history.

(56) References Cited

U.S. PATENT DOCUMENTS

| | | | | | |
|---|---|---|---|---|---|
| 3,743,946 | A | * | 7/1973 | Gass et al. ............... | 327/64 |
| 4,063,070 | A | * | 12/1977 | Delarue et al. ............. | 235/474 |
| 4,092,550 | A | * | 5/1978 | Lauffer ........................ | 327/74 |
| 4,570,089 | A | * | 2/1986 | Nagano ...................... | 327/115 |
| 5,257,301 | A | * | 10/1993 | Vanderbilt ................... | 377/47 |
| 6,037,812 | A | * | 3/2000 | Gaudet ....................... | 327/116 |
| 6,121,805 | A | * | 9/2000 | Thamsirianunt et al. .... | 327/175 |
| 7,342,459 | B2 | * | 3/2008 | Sobue ........................ | 331/1 A |

* cited by examiner

*Primary Examiner*—Jeffrey S Zweizig
(74) *Attorney, Agent, or Firm*—Garlick Harrison & Markison; Timothy W. Markison

(57) ABSTRACT

A clock circuit includes a waveform generator, a comparison module, and a clock signal module. The waveform generator is coupled to generate a waveform based on a reference oscillation. The comparison module is coupled to compare the waveform with a plurality of references to produce a plurality of waveform comparisons. The clock signal module is coupled to generate a clock signal from the plurality of waveform comparisons.

17 Claims, 5 Drawing Sheets

ARBITRARY CLOCK CIRCUIT AND APPLICATIONS THEREOF

CROSS REFERENCE TO RELATED PATENTS

NOT APPLICABLE

STATEMENT REGARDING FEDERALLY SPONSORED RESEARCH OR DEVELOPMENT

NOT APPLICABLE

INCORPORATION-BY-REFERENCE OF MATERIAL SUBMITTED ON A COMPACT DISC

NOT APPLICABLE

BACKGROUND OF THE INVENTION

1. Technical Field of the Invention

This invention relates generally to mixed signal circuitry and more particularly to clock circuits.

2. Description of Related Art

As is known, one or more clock circuits are included on integrated circuits to supply clock signals for other circuitry on an integrated circuit (IC). For example, a processing core may use one or more clock signals; memory may use one or more different clock signals, and input/output interfaces may use one or more of the same clock signals or still different clock signals. As another example, radio frequency (RF) circuitry uses one or more variable clock signals to provide one or more variable local oscillations. In the latter example, many RF applications require the local oscillation, and hence the clock signal, to be changed from one rate to another in a very short period of time (e.g., 10 micro-seconds to 10 milli-seconds).

As is further known, a clock circuit may be implemented in a variety of ways. For instance, a clock circuit may be implemented using a phase locked loop (PLL), a fractional-N synthesizer, a counter, a frequency divider, a frequency multiplier, a crystal oscillator, and/or a combination thereof. Of these implementations, a PLL and/or a fractional-N synthesizer are most commonly used to produce clock signals that require a tight tolerance and/or require fast and accurate rate adjustments.

While a PLL works well to provide an accurate and adjustable clock signal, it does have some practical limitations on the adjustability of the rate of the clock signal. For example, if the PLL includes a divider (M) that divides a reference oscillation prior to inputting into a phase detector and further includes a feedback divider (N), then the output oscillation will have a rate of N/M times the rate of the reference oscillation. In this example, if the desired ratio of N/M is a simple ratio (e.g., 3/2, 5/3, 6, etc.), the rate of the PLL and/or reference oscillation generator (e.g., a crystal oscillator) will typically fall in a range easily handled by a PLL. As the desired ratio becomes more complex (e.g., 137/23=5.96), the rate of the PLL and/or reference oscillation generator has to increase. For some ratios, the rate exceeds practical limitations of a PLL and/or reference oscillation generator. In addition, the bandwidth of the PLL limits the granularity of the ratio.

A fractional-N synthesizer provides a clock circuit that allows for fine adjustment of a clock without exceeding practical limitations of a PLL and/or of the reference oscillation generator by including a delta-sigma modulator in the feedback path. For example, if the desired ratio is 5.96, the delta-sigma modulator modulates the feedback divider between 5 and 6 such that, over time, the average feedback divider is 5.96. This approach, however, requires complex circuitry and may create jitter in the clock signal due to the switching between the divider values.

Therefore, a need exists for a clock circuit that can generate an arbitrary rate clock signal without some or all of the above limitations.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWING(S)

DETAILED DESCRIPTION OF THE INVENTION

Figure 1:
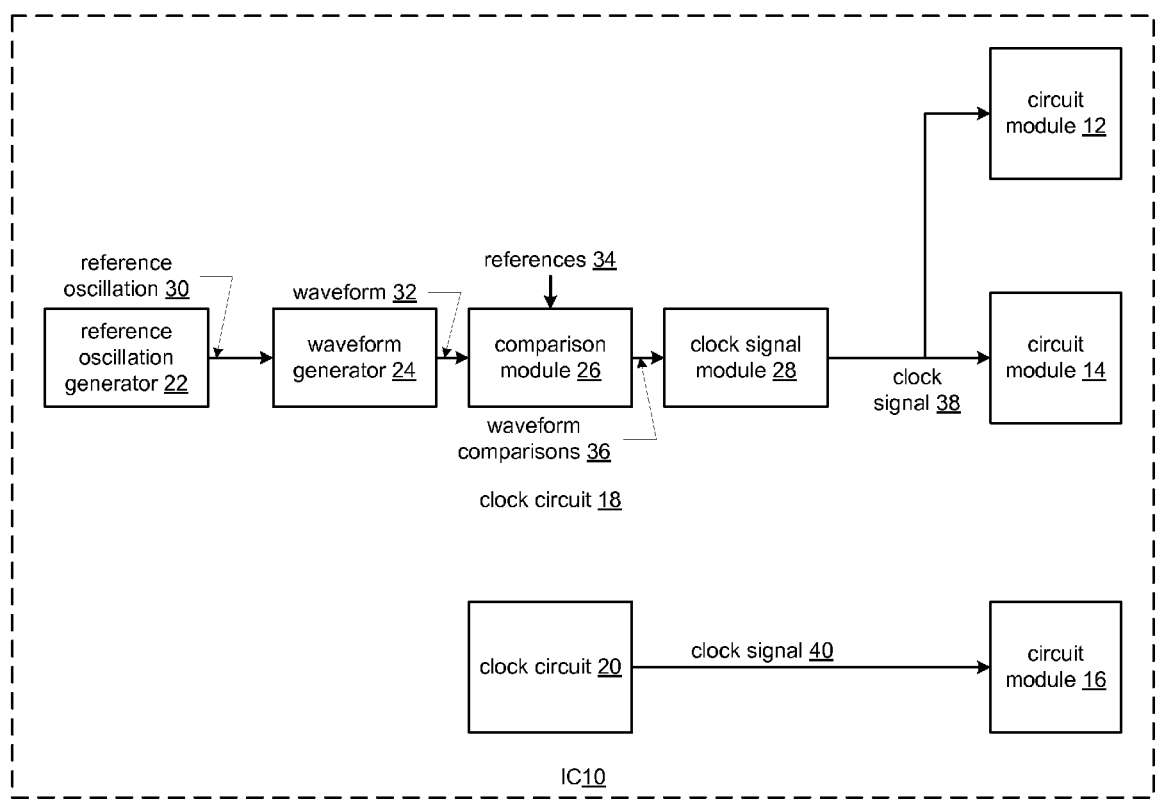
FIG. 1 is a schematic block diagram of an embodiment of an integrated circuit (IC) in accordance with the present invention.

FIG. 1 is a schematic block diagram of an embodiment of an integrated circuit (IC) that includes a plurality of circuit modules 12-16, one or more clock circuits 18-20 (two shown), and a reference oscillation generator 22. An embodiment of a clock circuit 18-20 includes a waveform generator 24, a comparison module 26, and a clock signal module 28.

The circuit modules 12-16 include circuitry that at least partially requires one or more clock signals to perform their corresponding function or functions. For example, a circuit module 12-16 may include, but is not limited to, a processing module, read only memory, random access memory, an external memory interface, an input/output (I/O) interface, a peripheral circuit interface (e.g., co-processor, digital camera, camcorder, television, radio, etc.), a direct down conversion RF mixer, a direct up conversion RF mixer, an intermediate frequency (IF) down conversion RF mixer, an IF up conversion mixer, a general purpose I/O (GPIO), and a multi-line serial interface (e.g., universal serial bus, 12S, 12C, SPI). A processing module may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module may have an associated memory and/or memory element, which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry.

The reference oscillation generator 22, which may be a crystal oscillator, a phase locked loop (PLL), a counter, and/or any other circuit that generates a pulse train, square-wave, and/or sinusoidal oscillation, generates a reference oscillation 30. The waveform generator 24 (embodiments of which will be described in greater detail with reference to FIGS. 2-4) generates a waveform 32 from the reference oscillation. In an embodiment, the waveform has a known varying magnitude over a period of the waveform, wherein the period of the waveform is M*Tref or 1/M Tref, where M=>1 and Tref is a period of the reference oscillation 30. For example, if the reference oscillation 30 has a period of 100 nano-seconds (e.g., a rate of 10 MHz) and the waveform generator 24 divides the frequency of the reference oscillation by an M of 10, then the waveform 32 will have a rate of 1 MHz (i.e., a period of 1 micro-second). The varying magnitude of the waveform 32 has a single value for any given point in time during the period of the waveform.

The comparison module 26 compares the waveform 32 with a plurality of references 34 to produce a plurality of waveform comparisons 36. For example, the reference 34 may include a plurality of voltage references varying in value from a peak value of the waveform to a minimum value of the waveform and are of varying values to intersect the waveform at substantially equally spaced time intervals. An example of this is provided in FIG. 3.

The clock signal module 28 generates a clock signal 38 from the plurality of waveform comparisons 36. In this embodiment, the clock signal 38 will have a rate corresponding to 2N/M times the rate of the reference oscillation or 2N*M times the rate of the reference oscillation depending on whether the waveform generator 24 divides or multiples the rate of the reference oscillation by M, where N represents the number of references 34. As an example, assume the reference oscillation has a rate of 10 MHz, N=13 and M=32, then the clock signal 38 will have a rate of 2*13/32*10 MHz, which equals 8.125 MHz. Note that clock circuit 20 may generate clock signal 40 in a similar manner.

Figure 2:
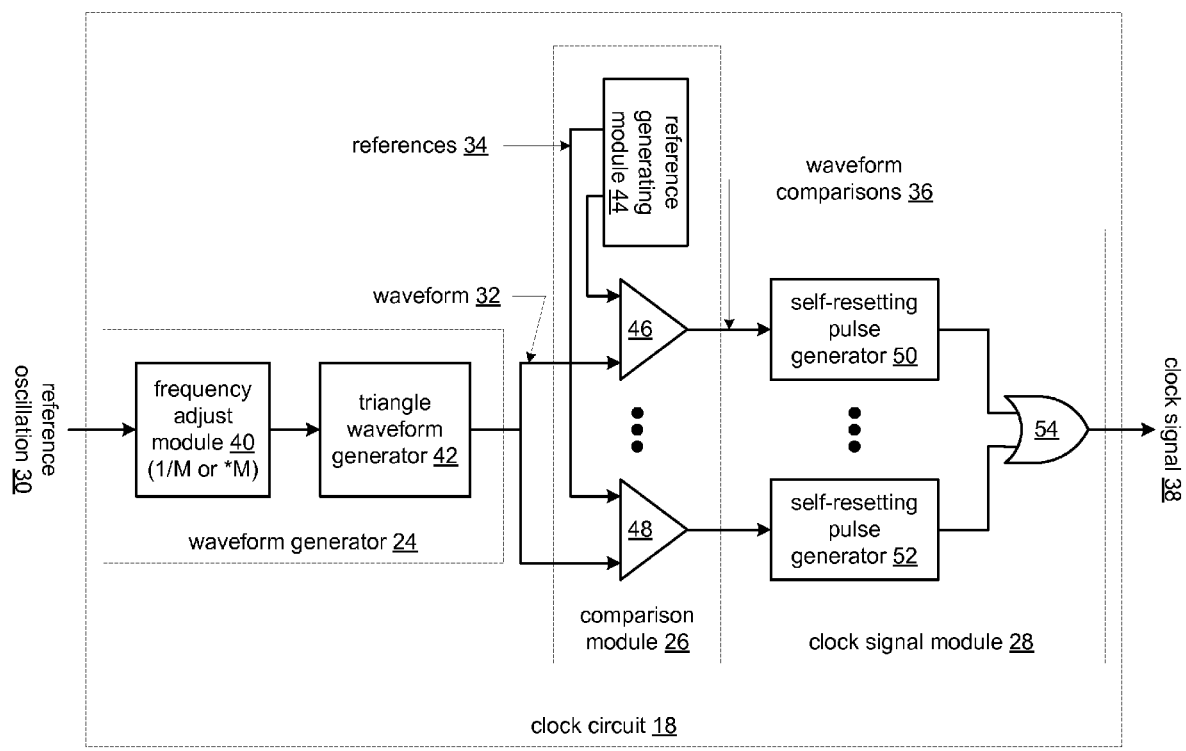
FIG. 2 is a schematic block diagram of an embodiment of a clock circuit in accordance with the present invention.

FIG. 2 is a schematic block diagram of an embodiment of a clock circuit 18 or 20 that includes the waveform generator 24, the comparison module 26, and the clock signal module 28. The waveform generator 24 includes a frequency adjust module 40 and a triangle waveform generator 42. The comparison module 26 includes at least one comparator (a plurality of comparators 46-48 are shown) and a reference generating module 44. The clock signal module 28 includes a plurality of self-resetting pulse generators 50-52, and an OR gate 54.

In operation, the frequency adjust module 40 adjusts the rate of the reference oscillation 30 by a factor of M to produce a frequency adjusted reference oscillation. In one embodiment, the frequency adjust module 40 is a frequency divider and in another embodiment, the frequency adjust module 40 is a frequency multiplier. As a frequency divider, the frequency adjust module 40 produces the adjusted reference oscillation to have a period of M*Tref and, as a frequency multiplier, the frequency adjust module 40 produces the adjusted reference oscillation to have a period of 1/M Tref, where M=>1 and Tref is a period of the reference oscillation 30.

The triangular waveform generator 42 generates a triangular waveform 32 from the adjusted reference oscillation. As such, the triangular waveform 32 has a period corresponding to the period of the adjusted reference oscillation (e.g., M*Tref or 1/M Tref). The magnitude of the triangular waveform 32 may range from Vss (e.g., ground, an AC ground, or a negative supply voltage) to Vdd (e.g., a positive supply voltage) or a fraction thereof.

The comparators 46-48 (e.g., N comparators, where N>=1) compare the triangular waveform 32 with a corresponding one of the plurality of references 34 to produce a plurality of waveform comparisons 36. The reference generating module 44, which may be an active device (e.g., transistors) or a passive device (e.g., resistors and/or capacitors) voltage divider, generates a desired number (e.g., N, where N>=1) of references 34 to achieve the desired rate of the clock signal 38. For example, if the desired rate of the clock signal is 8.125 MHz, the rate of the reference oscillation is 10 MHz, and the frequency adjust module 40 is set as a frequency divider with a divider value M of 32, then the value of N equals 13. As such, the reference generating module 44 generates 13 references 34 and the comparison module 26 includes thirteen comparators 46-48. Note that the value of N may be fixed or programmable depending on the application of the clock circuit 18-20.

Each of the self-resetting pulse generators 50-52 (e.g., a self-resetting flip-flop, a one-shot pulse generating logic circuit, etc.) receives a corresponding one of the waveform comparisons 36 and produces therefrom one or more pulses. Each pulse will have a pulse width such that a desired duty cycle of the clock signal 38 is achieved. An example of this is provided with reference to FIG. 3. The pulse width of each pulse may be adjusted in accordance with the desired rate of the clock signal, the rate of the reference oscillation 30, M, and/or N. In general, if a 50% duty cycle is desired, then the pulse width of a pulse substantially equals ½*[M*Tref/2N].

The OR gate 54 ORs the output of each of the self-resetting pulse generators 50-52 to produce the clock signal 38 that has a frequency Fclk=2*N/M*Fref. Note that the comparators 46-48 may have a slight input voltage offset that results in a slight time offset of the resulting waveform comparison. With equivalent design and layout of the comparators 46-48, the offset voltage can be minimized and substantially equal between the comparators 46-48. With the references 34 being accurately spaced in voltage, the resulting time offset will be substantially equal for all of the comparators, thus causing the clock signal to be slightly delayed from the reference oscillation, but with an accurate desired rate and an accurate desired duty cycle. Note that the reference generating module 44 may further include calibration circuitry to calibrate the passive and/or active devices to achieve the desired accuracy of the references 34.

Figure 3:
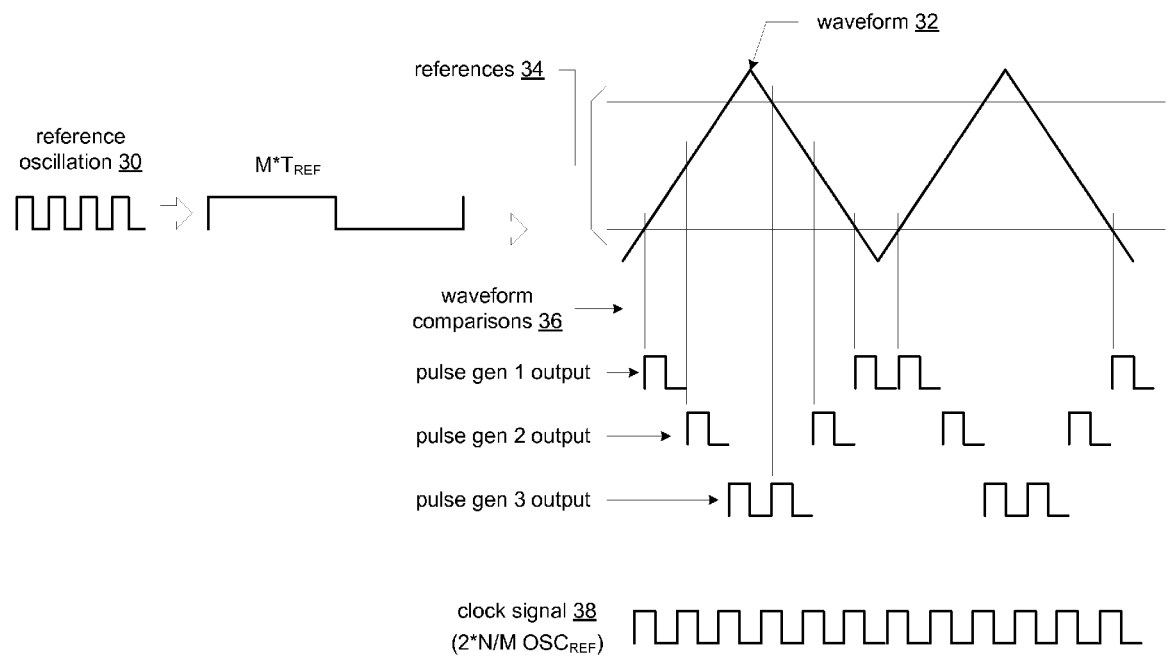
FIG. 3 is a block diagram of an example of operation of a clock circuit in accordance with the present invention.

FIG. 3 is a block diagram of an example of operation of a clock circuit 18, 20 that receives a reference oscillation 30. In this example, the reference oscillation 30 has a particular rate (e.g., X MHz) and thus has a particular period (e.g., Tref=1/X MHz). The frequency adjust module 40 divides the frequency of the reference oscillation by M to produce an adjusted reference oscillation with a rate of (1/M)*(X MHz) and a corresponding period of M*Tref. The triangular waveform generator 42 generates the triangular waveform 32 form the adjusted reference oscillation. As such, the triangular waveform 32 has the same period M*Tref as the adjusted reference oscillation.

In this example, the reference generating module 44 generates three reference 34 equally spaced with respect to the triangular waveform 32. As shown, each reference 34 intersects the triangular waveform 32 twice per period. For each intersection, a corresponding comparator 46-48 generates a waveform comparison 36, which provides a trigger for the corresponding self-resetting pulse generator 50-52. In response to the waveform comparison 36, each self-resetting pulse generator 50-52 generates a pulse having a specific pulse width. For a 50% duty cycle of the clock signal 38, the pulse width of each pulse is 1/2*[M*Tref/2*N]. The OR gate 54 ORs the pulses together to produce the clock signal 38, which, in this example, has a rate of (2*N/M)*(X MHz), where N equals three.

Figure 4:
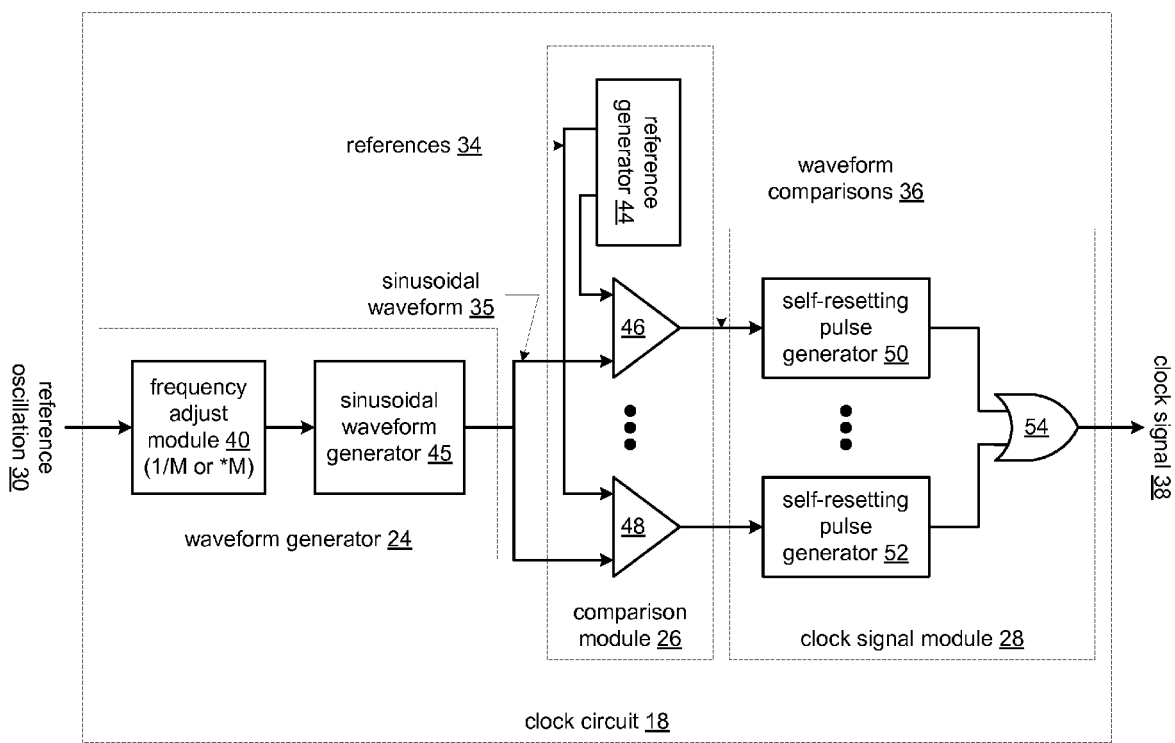
FIG. 4 is a schematic block diagram of another embodiment of clock circuit in accordance with the present invention.

FIG. 4 is a schematic block diagram of another embodiment of clock circuit 18 or 20 that includes the waveform generator 24, the comparison module 26, and the clock signal module 28. The waveform generator 24 includes a frequency adjust module 40 and a sinusoidal waveform generator 45. The comparison module 26 includes a plurality of comparators 46-48 and a reference generating module 44. The clock signal module 28 includes a plurality of self-resetting pulse generators 50-52, and an OR gate 54.

In operation, the frequency adjust module 40 adjusts the rate of the reference oscillation 30 by a factor of M to produce a frequency adjusted reference oscillation. In one embodiment, the frequency adjust module 40 is a frequency divider and in another embodiment, the frequency adjust module 40 is a frequency multiplier. As a frequency divider, the frequency adjust module 40 produces the adjusted reference oscillation to have a period of M*Tref and, as a frequency multiplier, the frequency adjust module 40 produces the adjusted reference oscillation to have a period of 1/M Tref, where M=>1 and Tref is a period of the reference oscillation 30.

The sinusoidal waveform generator 45 generates a sinusoidal waveform 35 from the adjusted reference oscillation. As such, the sinusoidal waveform 35 has a period corresponding to the period of the adjusted reference oscillation (e.g., M*Tref or 1/M Tref). The magnitude of the sinusoidal waveform 35 may range from Vss (e.g., ground, an AC ground, or a negative supply voltage) to Vdd (e.g., a positive supply voltage) or a fraction thereof.

The plurality of comparators 46-48 compare the sinusoidal waveform 35 with a corresponding one of the plurality of references 34 to produce a plurality of waveform comparisons 36. The reference generating module 44 generates a desired number (e.g., N) of references 34 to achieve the desired rate of the clock signal 38. The references 34 are of a value such that the resulting waveform comparisons 36 are equally spaced in time. For instance, if the sinusoidal waveform 35 is expressed as $A*\sin(\omega_{M*Tref}(t))$, where A is the amplitude, $\omega_{M*Tref}$ is the period, then at particular times (e.g., t), the amplitude can be readily determined, which provides the desired value for the references 34.

Each of the self-resetting pulse generators 50-52 receives a corresponding one of the waveform comparisons 36 and produces therefrom one or more pulses. Each pulse will have a pulse width such that a desired duty cycle of the clock signal 38 is achieved. The pulse width of each pulse may be adjusted in accordance with the desired rate of the clock signal, the rate of the reference oscillation 30, M, and/or N. In general, if a 50% duty cycle is desired, then the pulse width of a pulse substantially equals ½ *[M*Tref/2N]. The OR gate 54 ORs the output of each of the self-resetting pulse generators 50-52 to produce the clock signal 38.

Figure 5:
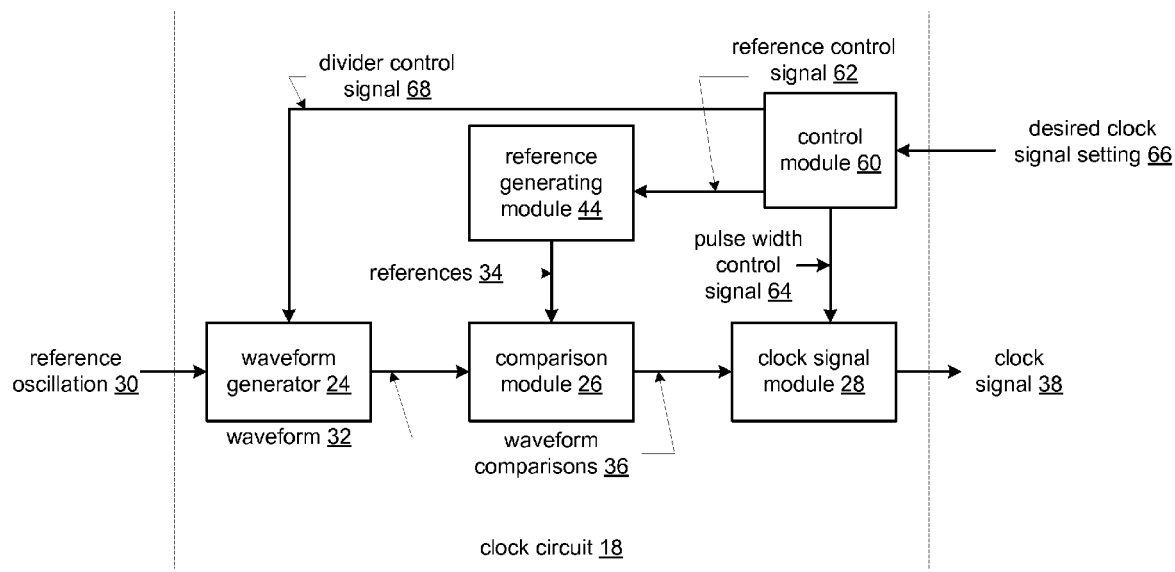
FIG. 5 is a schematic block diagram of another embodiment of clock circuit in accordance with the present invention.

FIG. 5 is a schematic block diagram of another embodiment of clock circuit 18, 20 that includes the waveform generator 24, the comparison module 26, the reference generating module 44, the clock signal module 28, and a control module 60. The control module 60 may be implemented via a separate processing module or as part of a processing module of the one of the circuit modules 12-16.

In this embodiment, the waveform generator 24 generates a waveform 32 based on a reference oscillation 30 and may further generate the waveform 32 in accordance with a divider control signal 68. For example, if the frequency adjust module 40 of the waveform generator 24 is a fixed frequency divider or a fixed frequency multiplier, then the control module 60 would omit the generation of the divider control signal 68. However, if the frequency adjust module 40 is programmable, the control module 60 would generate the divider control signal 68 to set the divider or multiplier value (M) of the frequency adjust module 40.

The reference generating module 44 generates a desired number of references 34 based on a reference control signal 62. For example, the reference generating module 44 may include a plurality of active and/or passive devices that may be coupled to provide N number of references, where N is derived from the reference control signal 62.

The comparison module 26, which includes at least one comparator (a plurality of comparators 46-48 are shown), compares the waveform 32 with the desired number of references 34 to produce a plurality of waveform comparisons 36. Note that the number of comparators 46-48 is equal to N, where N>=1.

The clock signal module 38 generates the clock signal 38 from the plurality of waveform comparisons 38, wherein the clock signal 38 has a duty cycle based on a pulse width control signal 64. As previously mentioned, to achieve a desired duty cycle of the resulting clock signal 38, the pulse width of the pulses produced by the self-resetting pulse generators 50-52 is based on N, M, and/or Tref. In particular, for a 50% duty cycle, the pulse width of each pulse should equal ½ *[M*Tref/2N], which is indicated in the pulse width control signal 64. Note that the control module 60 is coupled to generate the reference control signal 62, the pulse width control signal 64, and/or the divider control signal 68 based on a desired setting (e.g., rate, duty cycle, etc.) of the clock signal 38.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. A clock circuit comprises:
   a waveform generator coupled to generate a waveform based on a reference oscillation, wherein the waveform has a known varying magnitude over a period of the waveform and the known varying magnitude is substantially symmetrical about one-half of the period, wherein the period of the waveform is M*Tref or 1/M Tref, where M>1 and Tref is a period of the reference oscillation;
   a comparison module coupled to compare the waveform with N references to produce a N waveform comparisons, where N>1; and
   a clock signal module coupled to generate a clock signal from the N waveform comparisons.

2. The clock circuit of claim 1, wherein the waveform generator comprises:
   a frequency adjust module coupled to adjust frequency of the reference oscillation to produce the 1/M Tref period or the M*Tref period; and
   a triangle waveform generation module coupled to the frequency adjust module to generate a triangular waveform having the 1/M Tref period.

3. The clock circuit of claim 1, wherein the waveform generator comprises:
   a frequency adjust module coupled to adjust frequency of the reference oscillation to produce the 1/M Tref period or the M*Tref period; and
   a sinusoidal waveform generation module coupled to the frequency adjust module to generate a sinusoidal waveform having the 1/M Tref period.

4. The clock circuit of claim 1, wherein the comparison module comprises:
   N comparators to compare the waveform with the N references to produce the N waveform comparisons.

5. The clock circuit of claim 4 further comprises:
   a reference generator coupled to generate N voltage references as the N references.

6. The clock circuit of claim 1, wherein the clock signal module comprises:
   a plurality of self-resetting pulse generators coupled to produce a plurality of pulses based on the plurality of waveform comparisons, wherein a self-resetting pulse generator of the plurality of self-resetting pulse generators generates a pulse based on a corresponding one of the plurality of comparisons; and
   an OR gate coupled to OR the plurality of pulses to produce the clock signal that has a frequency substantially equal to 2*N/M*Fref, where Fref=1/Tref.

7. The clock circuit of claim 6 further comprises:
   the self-resetting pulse generator generating the pulse to a have a pulse width based on a number of the plurality of references and a period of the waveform.

8. A clock circuit comprises:
   a waveform generator coupled to generate a waveform based on a reference oscillation, wherein the waveform has a known varying magnitude over a period of the waveform and the known varying magnitude is substantially symmetrical about one-half of the period, wherein the period of the waveform is M*Tref or 1/M Tref, where M>1 and Tref is a period of the reference oscillation;
   a reference generating module coupled to generate a desired number of references based on a reference control signal;
   a comparison module coupled to compare the waveform with the desired number of references to produce N waveform comparisons;
   a clock signal module coupled to generate a clock signal from the N waveform comparisons, wherein the clock signal has a duty cycle based on a pulse width control signal; and
   a control module coupled to generate the reference control signal and the pulse width control signal based on a desired setting of the clock signal.

9. The clock circuit of claim 8, wherein the comparison module comprises:
   a desired number of comparators to compare the waveform with the desired number of references to produce the plurality of waveform comparisons, wherein the desired number of comparators is selected from a plurality of comparators based on a comparator control signal, wherein the control module generates the comparator control signal and wherein the desired number of comparators is equal to or greater than one.

10. The clock circuit of claim 8, wherein the clock signal module comprises:
    a plurality of self-resetting pulse generators coupled to produce a plurality of pulses based on the plurality of waveform comparisons, wherein a self-resetting pulse generator of the plurality of self-resetting pulse generators generates a pulse based on pulse width control signal; and an OR gate coupled to OR the plurality of pulses to produce the clock signal.

11. An integrated circuit (IC) comprises:

a first circuit module coupled to produce a function at a rate corresponding to a clock signal; and a clock circuit that includes:

a waveform generator coupled to generate a waveform based on a reference oscillation, wherein the waveform has a known varying magnitude over a period of the waveform and the known varying magnitude is substantially symmetrical about one-half of the period, wherein the period of the waveform is M*Tref or 1/M Tref, where M>1 and Tref is a period of the reference oscillation;

a comparison module coupled to compare the waveform with N references to produce N waveform comparisons, wherein N>1; and a clock signal module coupled to generate the clock signal from the N waveform comparisons.

12. The IC of claim 11, wherein the waveform generator comprises:

a frequency adjust module coupled to adjust frequency of the reference oscillation to produce the 1/M Tref period or the M*Tref period; and a triangle waveform generation module coupled to the frequency adjust module to generate a triangular waveform having the 1/M Tref period.

13. The IC of claim 11, wherein the waveform generator comprises:

a frequency adjust module coupled to adjust frequency of the reference oscillation to produce the 1/M Tref period or the M*Tref period; and a sinusoidal waveform generation module coupled to the frequency adjust module to generate a sinusoidal waveform having the 1/M Tref period.

14. The IC of claim 11, wherein the comparison module comprises:

N comparators to compare the waveform with the N references to produce the N waveform comparison.

15. The IC of claim 14 further comprises:

a reference generator coupled to generate N voltage references as the N references.

16. The IC of claim 11, wherein the clock signal module comprises:

a plurality of self-resetting pulse generators coupled to produce a plurality of pulses based on the plurality of waveform comparisons, wherein a self-resetting pulse generator of the plurality of self-resetting pulse generators generates a pulse based on a corresponding one of the plurality of comparisons; and an OR gate coupled to OR the plurality of pulses to produce the clock signal that has a frequency equal to 2*N/M*Fref, wherein Fref=1/Tref.

17. The IC of claim 16 further comprises:

the self-resetting pulse generator generating the pulse to a have a pulse width based on a number of the plurality of references and a period of the waveform.

* * * * *